(12) United States Patent
Fedynyshyn

(10) Patent No.: US 6,872,504 B2
(45) Date of Patent: Mar. 29, 2005

(54) HIGH SENSITIVITY X-RAY PHOTORESIST

(75) Inventor: Theodore H. Fedynyshyn, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 73 days.

(21) Appl. No.: 10/315,356

(22) Filed: Dec. 10, 2002

(65) Prior Publication Data

US 2004/0110091 A1 Jun. 10, 2004

(51) Int. Cl.$^7$ ............................................. G03F 7/004
(52) U.S. Cl. ............................... 430/270.1; 430/281.1; 430/286.1; 430/287.1; 430/311; 430/313
(58) Field of Search .......................... 430/270.1, 281.1, 430/286.1, 287.1, 311, 313

(56) References Cited

U.S. PATENT DOCUMENTS

| | | | |
|---|---|---|---|
| 4,125,672 A | 11/1978 | Kakuchi et al. | |
| 4,551,414 A | 11/1985 | Asmussen et al. | |
| 4,983,495 A | 1/1991 | Tsutsumi et al. | |
| 5,066,751 A | 11/1991 | Kotachi et al. | |
| 5,104,479 A | 4/1992 | Kotachi et al. | |
| 6,358,665 B1 * | 3/2002 | Pawlowski et al. | 430/270.1 |
| 6,653,048 B2 * | 11/2003 | Brock et al. | 430/270.1 |
| 2002/0037471 A1 | 3/2002 | Kishimura et al. | |
| 2002/0039700 A1 | 4/2002 | Kishimura et al. | |
| 2002/0051936 A1 | 5/2002 | Harada et al. | |
| 2002/0160297 A1 * | 10/2002 | Fedynyshyn et al. | 430/270.1 |
| 2002/0192592 A1 * | 12/2002 | Yasunami et al. | 430/270.1 |
| 2003/0129527 A1 * | 7/2003 | Kudo et al. | 430/270.1 |

OTHER PUBLICATIONS

Bucca D., et al., "Nonchemically Amplified Positive Photoresist for Synchrotron Radiation X–Ray Lithography," International Society of Optical Engineers (SPIE) Proceedings vol. 2438, pp. 403–412 (1995).

Fedynyshyn, T., et al., "High–Resolution Fluorocarbon Based Resist for 157–nm Lithography," International Society of Optical Engineers (SPIE), vol. 4345, pp. 296–307 (2001).

Pryzbilla, et al., "Hexafluoroacetone In Deep UV Resist Chemistry: New Resins, Dissolution Inhibitors And Crosslinkers," Journal of Photopolymer Science and Technology., vol. 5, No. 1 (pp. 85–92) (1992).

Serre, et al., "Influence of various electro–attractive substituents on the performances of acrylic type positive resists in microlithography," International Society of Optical Engineers (SPIE), vol. 393 pp. 205–209 (Nov. 11, 1993).

Tischer, P., "Advances in X–Ray Lithography," Federal Dept. of Research and Technology of the Federal Republic of Germany, pp. 46–51 (1980).

Kakuchi, et al., "Positive Type Resists for Microfabrication," Review of the Electrical Communication Laboratories, vol. 27 (1979).

Kakuchi, et al., "Poly (Fluoro Methacrylate) as Highly Sensitive, High Contract Positive Resist," J. Electrochem. Soc.: Solid State Science and Technology, pp. 1648–1651, (Oct. 1977).

* cited by examiner

Primary Examiner—Barbara L. Gilliam
(74) Attorney, Agent, or Firm—Thomas J. Engellenner; Reza Mollaaghababa; Nutter McClennen & Fish LLP

(57) ABSTRACT

The present invention provides methods for lithography utilizing X-ray radiation. More particularly, the methods of the invention can be employed for lithography at wavelengths in a range between about 0.8 nm and 30 nm, and more particularly, at wavelengths in a range between 0.8 and 1.2 nm. The methods of the invention employ photoresist compositions having fluorinated polymers with a fluorine content of at least about 10% by weight to provide enhanced sensitivity for X-ray lithography.

47 Claims, No Drawings

HIGH SENSITIVITY X-RAY PHOTORESIST

The Government has rights in this invention pursuant to contract Number F19628-90-C-0002 awarded by the Department of Defense (DoD), Defense Advanced Research Project Agency (DARPA), Microsystems Technology Office (MTO).

BACKGROUND

The present invention relates to lithography, and more particularly to photoresist methods and materials that accommodate short wavelength, high-energy, e.g., X-ray, lithography.

Manufacturing of integrated circuits has been greatly enabled by high-performance spin-on organic polymeric resists, but with some limitations. One limitation that must be overcome to perform efficient lithography at wavelengths below 100 nm is the unfavorable sensitivity-resolution tradeoff exhibited by conventional photoresists at these wavelengths. This is especially true in X-ray lithography where high throughput is currently limited by resists designed not for X-ray lithography but rather for 248 nm lithography. These resists operate at sensitivities that range from 120 to 200 mJ/cm$^2$ under X-ray exposure, significantly slower than 20 to 40 mJ/cm$^2$ generally desired for cost effective throughput.

To date, there has yet to be a resist that demonstrates sub-100 nm resolution while having X-ray sensitivity in the range of 20 to 40 mJ/cm$^2$. In addition to sensitivity and resolution requirements, resists must maintain critical linewidth control throughout the patterning process, including both imaging and subsequent transfer via plasma etch. Line-edge roughness on the order of 5–10 nm is a concern at 250 nm, but will render a lithographic process unworkable when critical dimensions fall below 100 nm.

From a resist viewpoint, all advanced energy sources can be categorized as one of two types. The first type provides highly absorbing energy such as 157 nm, EUV and low-kV electrons, that is fully absorbed by the top surface of the resist. The second type provides highly penetrating energy, such as X-ray and high-kV electrons, that is only partially absorbed by the resist layer, with much of the exposure energy passing into the underlying substrate. The low level of exposure energy that is absorbed by the resist layer leads to low resist sensitivities, which can in turn lead to reduced manufacturing throughput.

Thus, it is evident that there is a need for improved photoresist materials and methods for the use thereof in lithographic processes at wavelengths below about 100 nm. Indeed, there is a need for resist materials with increased energy absorption ability that can be widely used in X-ray and other high-penetration short-wave energy sources, and which exhibit improved line-width roughness. These improved materials and methods must further be suitable to meet commercial manufacturing throughput requirement. More specifically, there exists a need for photolithographic processes that can demonstrate sub-100 nm resolution while having X-ray sensitivity in a desired range of 20 to 40 mJ/cm$^2$.

SUMMARY OF THE INVENTION

The present invention provides methods for lithography, and more particularly, methods for lithography using ultra-short wavelength energy exposure, e.g., X-ray lithography. The methods of the invention advantageously allow performing lithography on a variety of substrates, such as, silicon or gallium arsenide, in the sub-100 nm wavelength range, for example, in a range of about 0.1 nm to about 30 nm, or a range of about 0.5 nm to about 15 nm, or in a range of about 0.5 nm to about 10 nm, or more preferably in a range of about 0.8–1.2 nm, with a sensitivity in a range of about 20 to 40 mJ/cm$^2$.

In one aspect, a method of the invention includes a step of applying a photoresist, which contains a polymer with a fluorine content of at least 10%, or at least 20%, or at least 25%, or at least 30%, or at least 35%, or at least 40%, or at least 45%, or at least 50%, by polymer weight and an acid generator, to a substrate. The applied photoresist is then exposed to an ultra-short wavelength high-energy actinic radiation that effects the release of electrons from photoresist's fluorine atoms. The phrase "ultra-short wavelength high-energy actinic radiation," as used herein, refers to radiation having wavelength components below about 100 nm, and preferably in a range of about 0.1 nm to about 30 nm, preferably in a range of about 0.5 nm to about 15 nm, more preferably in a range of about 0.5 nm to about 10 nm, and most preferably in a range of about 0.8 nm to about 1.2 nm. The released electrons react with the photo-acid generator to release acid. The acid can then catalytically change the solubility of the resist. The base soluble regions can then be optionally removed by utilizing a basic solution.

In a related aspect, the fluorine content of a polymer component of the photoresist composition applied to the substrate is selected to be in a range of about 10 percent to about 80 percent, and preferably in a range of about 20 percent to about 75 percent, or in a range of about 25 percent to about 75 percent, or in a range of about 30 percent to about 75 percent, or in a range of about 35 percent to about 75 percent, or in a range of about 40 percent to about 75 percent, or in a range of about 45 percent to about 75 percent, or in a range of about 50 percent to about 75 percent, or in a range of about 30 percent to about 60 percent by polymer weight.

In another aspect, the fluoropolymer component of the photoresist composition applied to a substrate can be selected to include a fluorinated alkylene moiety. Alternatively, or in addition, the fluoropolymer can be selected to include a fluorinated acrylate or a fluorinated methacrylate moiety.

In another aspect, the applied photoresist is exposed to a beam of electrons having an energy in a range of about 1 to about 200 keV, and more preferably, in a range of about 1 to about 100 keV. The electron beam effects the release of electrons from the photoresist's fluorine atoms, and the released electrons react with the photo-acid generator to release acid.

A method of invention as described above utilizes photoresist compositions that contain fluorinated polymers with fluorine contents that are selected so as to increase absorption rate of the incident energy by the resist, thereby providing increased sensitivity and higher manufacturing throughput. For example, the fluorine content of the photoresist's polymer can be at least 10% by polymer weight. In some embodiments, the polymer's fluorine content is selected to be greater than about 20%, or greater than about 25%, or greater than about 30%, or greater than about 35%, or greater than about 40%, or greater than about 45%, or greater than about 50%, by polymer weight. Further, the polymer's fluorine content can be selected to be in a range of about 10 percent to about 80 percent, and preferably in a range of about 20 percent to about 75 percent, or in a range of about 25 percent to about 75 percent, or in a range of about 30 percent to about 75 percent, or in a range of about 35 percent to about 75 percent, or in a range of about 40 percent to about 75 percent, or in a range of about 45 percent to about 75 percent, or in a range of about 50 percent to about 75 percent, or in a range of about 30 percent to about 60 percent by polymer weight. Further, the acid generators utilized in the photoresist compositions can also optionally include fluorine atoms.

In another aspect, a polymeric material utilized in the photoresist composition of the invention can be selected as a polymer blend of fluorine containing monomers. For example, the polymer can be a copolymer, a terpolymer, or another similar polymer composition. The term polymer is used herein to describe a structure that has a backbone formed of repeating units, typically monomers. The backbone can be formed from a single repeating unit, and therefore can be a homogenous chain. Alternatively, the backbone can be formed of two different repeating units, thereby forming a copolymer. The two different repeating units can be present in the copolymer in different amounts. A ratio of the amount of one unit to the other can represent the degree of heterogeneity of the copolymer. Alternatively, the backbone can be formed of three different repeating units, thereby forming a terpolymer. The different repeating units can be present in the terpolymer in different amounts, and the ratio of the amount of one unit relative to others can represent the degree of the heterogeneity of the terpolymer The term polymer is used herein to refer to a polymer formed of a single monomer group or a class of polymer structures formed from plural monomer groups, and is understood to describe copolymers, terpolymers, tetra polymers and so forth. Additionally, the term copolymer is understood to describe block and graft copolymer structures.

In a related aspect, the polymer can be selected to be hexafluoroisopropanolstyrene. Further, the polymer can be selected to be either a copolymer or terpolymer in which one of the starting monomers is selected from either 4-hexafluoroisopropanolstyrene, 3-hexafluoroisopropanolstyrene, or 2-hexafluoroisopropanolstyrene. Alternatively, a copolymer or terpolymer in which one of the starting monomers is 2,3,5,6-tetrafluoro-4-hydroxystyrene can be utilized.

In a related aspect, a terpolymer can be utilized in a photoresist composition in which one monomer is selected to be hexafluoroisopropanolstyrene and is copolymerized with a second monomer that can undergo dissolution changes and a third monomer, which is selected to increase the X-ray absorbance of the polymer and formulated resist. Examples of a third monomer that can be used to increase the X-ray absorbance of the photoresist include tert-butyl [2,2,2-trifluoro-1-trifluoromethyl-1-(4-vinylphenyl)ethoxy] acetate, 1-(2,2,2-trifluoro-1-methoxymethoxy-1-trifluoromethylethyl)-4-vinylbenzene, and 2,2,3,3,4,4,4-heptafluoro-1-(4-vinylphenyl)-1-butanone.

In another aspect, the ultra-short wavelength high energy radiation can be selected to be photons with wavelengths in the sub-100 nm range, e.g., in a range of about 0.1 nm to about 30 nm, or a range of about 0.5 nm to about 15 nm, or a range of about 0.5 nm to about 10 nm, and more preferably in a range of about 0.8 nm to about 1.2 nm. Alternatively, the ultra-short wavelength high energy radiation can be selected to be a beam of electrons having an energy in a range of about 1 to about 200 keV, or other high energy low absorbance radiation.

The invention can be better understood by reference to the following detailed description.

DETAILED DESCRIPTION

The present invention provides methods for lithography that employ photoresist materials (hereinafter referred to as either "photoresist" or "resist") with sensitivity suitable for lithographic processes using energy sources with wavelengths less than about 100 nm, e.g., in the 0.8 to 1.2 nm range. Such sources include, for example, X-ray, electron beam, and other high-energy low absorbent radiation. Such photoresists are based on the incorporation of fluorine in polymers and photoacid generators (PAGs) that are employed in the resist formulation, and are capable of supporting lithographic imaging in less than 100 nm range.

Resist materials that are sensitive to X-ray radiation are generally sensitive to electron beam radiation and function in the same fashion. In fact, there is a strong correlation between the sensitivity to X-ray radiation and a corresponding sensitivity to electron beam radiation. Hence, hereinafter the term X-ray can refer to X-ray or electron beam energy. This correlation and the structure-dependent response to X-ray and electron beam exposure has been thought to indicate that the chemical reactions responsible for generation of differential solubility in X-ray and electron beam resists do not stem directly from interaction of material with the primary beam. In both cases the primary beam greatly exceeds the bond strength and ionization potential of organic materials.

It should be appreciated that if the primary beam were responsible for the chemical changes, no functional group selectivity would be expected. In fact, it is now widely accepted that the primary high-energy beam interacts with the resist material in a way dependent only on the capture cross-section. This interaction is determined by the density and atomic (elemental) structure of the resist film—and not by its molecular structure—to produce a cascade of lower secondary energy and Auger electrons that have a short range in the material and induce molecular structure-dependent reactions. Because the chemistry results from interaction of the secondary low-energy electrons, the resist does not differentiate in response to the source of these low-energy electrons.

The secondary electrons produced by X-ray and electron beam radiation have similar effects on resist molecules. Consequently, the chemical response to high-energy radiation is similar regardless of the nature of the primary beam, and the extent of response and sensitivity depends on the efficiency with which the primary beam interacts with the resist film to produce the secondary electrons. This efficiency depends in turn on the capture cross section, which is related to the beam energy and the atomic composition of the resist.

Applicant has discovered that photoresist cross-sections and density can be increased by addition of high levels of fluorine to the photoresist composition through the use of fluoropolymers and fluoro-containing photoacid generators (PAGs), as will be shown in the examples below. This leads to increased X-ray absorbance and subsequent enhanced secondary electron production. The increased level of secondary electrons leads to increased PAG conversion to photogenerated acid, thereby generating more acid for each unit of incident X-ray photon. The higher acid generation further leads to increased resist sensitivity and higher manufacturing throughputs.

Incorporation of fluorine in the photoresist composition increases the resist's absorbance in the X-ray region of the electromagnetic spectrum, which is often considered as residing between 0.1 and 30 nm. The portion of this spectral range in which this invention will be of particular importance is the region between about 0.5 and about 15.0 nm, and particulary the region between about 0.5 and about 10.0 nm, and more particularly the region between about 0.8 and about 1.2 nm. It is in this region that the relatively low absorbance levels of conventional resists can lead to relatively low resist sensitivity. An increase in absorbance of photoresists utilized in methods of the invention will lead to increased resist sensitivity. Further, such resist materials demonstrate favorable sub-100 nm resolution, thus exhibiting an improved sensitivity-resolution tradeoff.

One technique known for improving the sensitivity-resolution trade-off in X-ray lithography is to improve acid generation efficiency by both creating more acid from each imaging event (quantum of exposure energy) and using the created acid more efficiently. Increased acid generation can be accomplished by increasing the energy absorbed by the PAG through either increasing PAG concentration or adding specific high-Z materials to the PAG or polymer structure. High-Impedance (High-Z) materials, such as iodine, have been used to increase the sensitivity of diazonaphtoquinone (DNQ) resists when exposed to X-rays, by direct attachment to the DNQ ring. This is described in Bucca, D. et al., "Nonchemically amplified positive photoresist for synchotron radiation X-ray lithography," International Society of Optical Engineers (SPIE) Proceedings Vol. 2438, pp 403–412 (1995). But even higher levels of iodine or other specific high-Z material must be incorporated for the resist to approach the required sensitivity suitable for ultra-short wavelengths.

Applicant has discovered that one specific element that can be incorporated into X-ray resists that is particularly effective at absorbing 0.8 to 1.2 nm X-ray radiation is fluorine. The X-ray capture cross-section for several selected elements-that have been employed in resist materials is given in Table 1. Although the absolute capture cross-section decreases with decreasing wavelength, the relative capture cross-section remains fairly constant. This is easily observed by normalizing all capture cross-sections to that of carbon at each specific wavelength. Table 1 illustrates that the incorporation of large levels of fluorine in the resist can result in significant increase in the resist's capture cross section.

TABLE 1

Capture cross section of selected elements at three X-ray wavelengths in $cm^2/g$ and normalized to the wavelength dependent capture cross section of carbon.

| Element | 1.2 nm | Normalized | 1.0 nm | Normalized | 0.8 nm | Normalized |
|---|---|---|---|---|---|---|
| H | 6 | 0.003 | 3 | 0.002 | 2 | 0.003 |
| C | 1983 | 1.000 | 1230 | 1.000 | 657 | 1.000 |
| Si | 1425 | 0.719 | 897 | 0.729 | 500 | 0.761 |
| O | 4152 | 2.094 | 2646 | 2.151 | 1467 | 2.233 |
| S | 2276 | 1.148 | 1440 | 1.171 | 802 | 1.221 |
| F | 5121 | 2.582 | 3320 | 2.699 | 1864 | 2.837 |
| Cl | 2538 | 1.280 | 1630 | 1.325 | 916 | 1.394 |
| Br | 2389 | 1.205 | 1598 | 1.299 | 957 | 1.457 |
| I | 8375 | 4.223 | 6012 | 4.888 | 3693 | 5.621 |

Polymers containing high levels of fluorine that are capable of acting as high resolution resists have already been prepared by Lincoln Laboratory, the assignee herein, and shown to be capable of 40 nm resolution, as described in Fedynyshyn, T. et al., "High-resolution fluorocarbon based resist for 157-nm lithography," International Society of Optical Engineers (SPIE) Proceedings Vol. 4345, (2001). Therein are described polymers based on hexafluoroisopropanol styrene (HFIP-styrene) and optionally containing 3,5-di-(trifluoromethyl)-styrene (DTF-styrene) that contain upwards of 50% fluorine by weight. Polymers based on HFIP-styrene were first described as acetal based 248-nm resists having dissolution properties similar to that of hydroxystyrene (HOST) based resist polymers and a slightly lower 248-nm absorbance. See, Pryzbilla K. J et al, *J. Vac. Sci. Technol.*, 1672, 500 (1992), and Pryzbilla K. J et al, *J. Photopolym. Sci. Technol.*, 5, 85 (1992). Their use as high-resolution 157-nm resists was recently shown based on their low 157-nm absorbance.

Applicant has performed theoretical calculations that show HFIP-styrene based resists can also be used to increase the capture cross-section at X-ray wavelengths and thus promote the cascade of secondary electrons necessary for the development of high-sensitivity high-resolution X-ray resists.

Table 2 shows capture cross-sections of four model polymers and two imaging copolymers based on these theoretical calculatons for three X-ray wavelengths. The calculations incorporate the contributions of the respective elements based on their weight percent incorporation in the polymer. The X-ray absorbance can be determined in units of absorbance per centimeter by multiplying the capture cross-section by the polymer density, as also shown in Table 2. Poly(hydroxystyrene) (p-HOST) and poly(t-butylacrylate) (p-TBA) are model compounds for 248-nm based resists and their capture cross-section is given in Table 2 as is that of 60:40 poly(hydroxystyrene-co-t-butyl acrylate) (p-HOST-co-TBA); a typical variation of the environmentally stable chemically amplified photoresist (ESCAP) polymer that forms the backbone on many commercial 248-nm resists. The capture cross-section values can be compared to those of poly(hexafluoroisopropanol styrene) (p-HFIP-styrene) and poly(3,5-di-(trifluoromethyl)-styrene) (p-DTFM-styrene), two model compounds for X-ray resists, and also poly(hexafluoroisopropanol styrene-co-t-butyl acrylate) (p-HFIP-styrene-co-TBA) a highly fluorinated variation of the ESCAP polymer.

TABLE 2

Capture cross section of selected polymers at three X-ray wavelengths in $cm^2/g$ and the density of the polymers in $g/cm^3$.

| Polymer | 1.2 nm | 1.0 nm | 0.8 nm | Density |
|---|---|---|---|---|
| p-HOST | 2139 | 1336 | 721 | 1.060 |
| p-TBA | 2338 | 1467 | 797 | 0.875 |
| p-HFIP-styrene | 3544 | 2273 | 1261 | 1.334 |
| p-DTFM-styrene | 3705 | 2381 | 1325 | 1.334 |
| p-HOST-co-TBA | 2218 | 1389 | 751 | 0.986 |
| p-HFIP-styrene-co-TBA | 3062 | 1951 | 1237 | 1.150 |

As will be appreciated by one skilled in the art, the above calculations show that p-HFIP-styrene and p-DTFM-styrene have significantly higher capture cross-sections than p-HOST and p-TBA. Further, a route exists, through the use of highly fluorinated polymers, to increase the X-ray-polymer interaction leading to increased production of the PAG transforming secondary, low-energy electrons. A similar increase in X-ray absorbance and production of low-energy electrons is expected when p-HFIP-styrene-co-TBA is compared to p-HOST-co-TBA. The calculated X-ray absorbance for the six polymers, both in units of $cm^{-1}$ and normalized to p-HOST-co-TBA, is presented in Table 3.

One significance of Table 3 is the comparison of the two polymers capable of high-resolution lithography, i.e., p-HOST-co-TBA and p-HFIP-styrene-co-TBA. It is noted that an increase in X-ray absorbance by a factor of 1.6 to 1.7 is expected for the fluorinated polymer. Although the absolute polymer absorbance will decrease with decreasing X-ray wavelength, the relative increase in absorbance expected with the fluorinated polymers is fairly constant throughout the 0.8 to 1.2 nm wavelength range, as expected based on Applicants calculations. This increase in absorbance should directly translate into a factor of 1.6 to 1.7 increase in X-ray sensitivity compared to traditional 248-nm resists employed in X-ray lithography. Thus the substitution of p-HFIP-styrene-co-TBA for the p-HOST-co-TBA polymer employed in many commercial 248-nm sensitive resists will result in doubling of the X-ray sensitivity with no expected loss to imaging performance.

TABLE 3

Capture cross section of selected polymers at three X-ray wavelengths in cm$^{-1}$.

| Polymer | 1.2 nm | Normalized | 1.0 nm | Normalized | 0.8 nm | Normalized |
|---|---|---|---|---|---|---|
| p-HOST | 2267 | 1.037 | 1416 | 1.034 | 764 | 1.031 |
| p-TBA | 2045 | 0.935 | 1284 | 0.938 | 698 | 0.941 |
| p-HFIP-styrene | 4729 | 2.162 | 3032 | 2.214 | 1682 | 2.271 |
| p-DTFM-styrene | 4942 | 2.260 | 3177 | 2.320 | 1767 | 2.385 |
| p-HOST-co-TBA | 2187 | 1.000 | 1369 | 1.000 | 741 | 1.000 |
| p-HFIP-styrene-co-TBA | 3522 | 1.610 | 2244 | 1.639 | 1237 | 1.670 |

The incorporation of highly absorbing materials into the PAG can be accomplished in several ways: either by adding highly absorbing elements to the photo-generated acid or to the non-acid portion of the PAG. Several highly fluorinated photo-acids exist, such as perfluoro-butane sulfonic acid ($C_8F_{17}SO_3H$) and perfluoro-octane sulfonic acid ($C_4F_9SO_3H$). As described above, the addition of high levels of fluorine will act to increase the total absorbance of the resist and as such the total amount of acid generated at a given dose. The non-acid generating portion of the PAG, also known as the ballast group, can also be modified for increased resist absorbance. Di-phenyl and di-t-butylphenyl iodonium based PAGs are often used in chemically amplified resist systems. These ballast groups can be modified with increasing levels of fluorine or iodine to further increase PAG and resist absorbance and lead to the production of higher levels of photo-acid per incident X-ray photon. This represents a second method to increase resist sensitivity by utilizing the incident energy dose more efficiently.

The teachings herein cover the incorporation of fluorine into both polymers and PAGs that are employed in the resist formulation. The use of fluorine in any part of the PAG will lead to an increase in resist absorbance and will increase resist sensitivity. The relatively low levels of PAG in resist formulations, less then 10% by weight and typically less then 5% by weight, limits the total amount of fluorine in the resist formulation that can be incorporated by utilizing fluorinated PAGs.

It is important to note, as also stated above, that employing fluorinated polymers increases the total resist absorbance in X-ray wavelengths. Because the polymer constitutes typically between 90 and 98% of the total resist films, an increase in the fluorine content of the polymer enhances X-ray absorbance comparable with an equal fluorine increase in the resist as a whole. Thus, a preferred embodiment of the invention employs fluorine-containing polymers in the resist together with optionally fluorine containing PAGs. The total level of fluorine in the resist is preferably selected to be at least 10% by weight, or at least 20%, or at least 25%, or at least 30%, or at least 35%, or at least 40%, or at least 45%, or at least 50% by weight. For example, the total level of fluorine in the resist can be in a range of about 10 percent to about 80 percent, and preferably in a range of about 20 percent to about 75 percent, or in a range of about 25 percent to about 75 percent, or in a range of about 30 percent to about 75 percent, or in a range of about 35 percent to about 75 percent, or in a range of about 40 percent to about 75 percent, or in a range of about 45 percent to about 75 percent, or in a range of about 50 percent to about 75 percent, or in a range of about 30 percent to about 60 percent by weight.

Some examples of polymers that contain high levels of fluorine that can be employed in resist formulations are copolymers or terpolymers of hexafluoroisopropanolstyrene. Resists formulated with these polymers can greatly improve resist sensitivity at X-ray wavelengths. Of course, there are other polymers that also contain high levels of fluorine that can be suitable for practicing the present invention.

Accordingly, in some embodiments, the polymer employed can be either a copolymer or terpolymer in which one of the starting monomers is selected from either 4-hexafluoroisopropanolstyrene, 3-hexafluoroisopropanolstyrene, or 2-hexafluoroisopropanolstyrene.

One example is a polymer in which some of the hexafluoroisopropanolstyrene is inhibited by t-butoxycarbonyloxy. This polymer is capable of acid catalyzed dissolution changes in much the same way as the polyhydroxystyrene analog. A second example is a copolymer in which the hexafluoroisopropanolstyrene is copolymerized with t-butylacrylate or t-butylmethacrylate. This polymer is also capable of acid catalyzed dissolution changes in which the t-butyl ester is cleaved to yield a carboxylic acid. A third example is a polymer in which some of the hexafluoroisopropanolstyrene is inhibited by a ketal or acetal. This polymer is capable of acid catalyzed dissolution changes in much the same way as the polyhydroxystyrene analog. A fourth example is a polymer in which some of the hexafluoroisopropanolstyrene is inhibited by the formation of a t-butyl ether acetate. This polymer is capable of acid catalyzed dissolution changes in which the t-butyl ester is cleaved to yield a carboxylic acid.

Further examples include a copolymer or terpolymer in which one of the starting monomers is 2,3,5,6-tetrafluoro-4-hydroxystyrene. One example is a polymer in which some of the 2,3,5,6-tetrafluoro-4-hydroxystyrene is inhibited by t-butoxycarbonyloxy. This polymer is capable of acid catalyzed dissolution changes in much the same way as the polyhydroxystyrene analog. A second example is a copolymer in which the 2,3,5,6-tetrafluoro-4-hydroxystyrene is copolymerized with t-butylacrylate or t-butylmethacrylate. This polymer is also capable of acid catalyzed dissolution changes in which the t-butyl ester is cleaved to yield a carboxylic acid. A third example is a polymer in which some of the 2,3,5,6-tetrafluoro-4-hydroxystyrene is inhibited by a ketal or acetal. This polymer is capable of acid catalyzed dissolution changes in much the same way as the polyhydroxystyrene analog. A fourth example is a polymer in which some of the 2,3,5,6-tetrafluoro-4-hydroxystyrene is inhibited by the formation of a t-butyl ether acetate. This polymer will be capable of acid catalyzed dissolution changes in which the t-butyl ester is cleaved to yield a carboxylic acid.

Further examples include a copolymer or terpolymer in which one of the starting monomers is 2,3-di (hexafluoroisopropanol)styrene, or 2,4-di (hexafluoroisopropanol)styrene, or 2,5-di (hexafluoroisopropanol)styrene, or 2,6-di (hexafluoroisopropanol)styrene, or 3,4-di (hexafluoroisopropanol)styrene, or 3,5-di (hexafluoroisopropanol)styrene.

One example is a polymer in which some of the di(hexafluoroisopropanol)styrene is inhibited by t-butoxycarbonyloxy. This polymer is capable of acid catalyzed dissolution changes in much the same way as the polyhydroxystyrene analog. A second example is a copolymer in which the di(hexafluoroisopropanol)styrene is copolymerized with t-butylacrylate or t-butylmethacrylate. This polymer is also capable of acid catalyzed dissolution changes in which the t-butyl ester is cleaved to yield a carboxylic acid. A third example is a polymer in which some of the di(hexafluoroisopropanol)styrene is inhibited by a ketal, an acetal, a bis-ketal, or a bis-acetal. This polymer is capable of acid catalyzed dissolution changes in much the same way as the polyhydroxystyrene analog. A fourth example is a polymer in which some of the di(hexafluoroisopropanol)styrene is inhibited by the formation of a t-butyl ether acetate. This polymer is capable of acid catalyzed dissolution changes in which the t-butyl ester is cleaved to yield a carboxylic acid.

A further example is a terpolymer in which the hexafluoroisopropanolstyrene is copolymerized with a monomer that can undergo dissolution changes and a third monomer which is selected to increase the X-ray absorbance of the polymer and formulated resist. Examples of a monomer that can undergo dissolution changes are t-butylacrylate or t-butylmethacrylate. Examples of the third monomer that can be used to increase the X-ray absorbance are tert-butyl [2,2,2-trifluoro-1-trifluoromethyl-1-(4-vinylphenyl)ethoxy] acetate, 1-(2,2,2-trifluoro-1-methoxymethoxy-1-trifluoromethylethyl)-4-vinylbenzene, and 2,2,3,3,4,4,4-heptafluoro-1-(4-vinylphenyl)-1-butanone.

Other fluorine containing monomers are anticipated that can be polymerized to give either polymers, copolymers, or terpolymers that can be employed in X-ray resists. Some examples are 3,5-di(trifluoromethyl)styrene, tetrafluoroethylene, trifluoroethylene, difluoroethylene, tetrafluorohydroxystyrene, t-butyl trifluoromethylacrylate, trifluoromethylacrylic acid, trifluoromethylacrylic acid esters, t-butyl fluoroacrylate, fluoroacrylic acid, fluoroacrylic acid esters, 2,2,3,4,4-pentafluorobut-3-enoic esters, 1,1 di(trifluoromethyl)-but-3-enol, 1,1 di(trifluoromethyl)-prop-2-enol, 2-fluorostyrene, 3-fluorostyrene, 4-fluorostyrene, 2,3,4,5,6-pentafluorostyrene, 2-trifluoromethylstyrene, 3-trifluoromethylstyrene, 4-trifluoromethylstyrene, 2-hexafluoroisopropyl styrene, 3-hexafluoroisopropyl styrene, 4-hexafluoroisopropyl styrene, 2-trifluoroacetyl styrene, 3-trifluoroacetyl styrene, 4-trifluoroacetyl styrene, 4-(1-oxy-2,2,3,3,4,4,4-heptafluorobutyl)styrene, 2-t-butyl acetate-hexafluoroisopropanol styrene, 3-t-butyl acetate-hexafluoroisopropanol styrene, 4-t-butyl acetate-hexafluoroisopropanol styrene, hexafluoroisopropyl acrylate, 2,3,5,6-tetrafluoro-4-hydroxystyrene. Of the above mentioned monomers, derivatives of such monomers by forming acid label blocking groups of alcohols or acids such as by conversion to esters, acetals, ketals, or carbonates will also find use within the invention.

In addition to the polymers described above, a photoresist composition of the invention can also contain a small amount of base which may help to stabilize the polymer system. In general, less than 1% of the polymer composition is a base component, based on the total weight of the polymer composition, e.g., less than 0.5%. Suitable bases typically are organic bases known in the art such as tetrabutylammonium hyroxide, diazabicyclo[5.4.0]undec-7-ene, diphenyl amine, trioctyl amine, or triheptyl amine.

Further, a photoresist composition of the invention can include a photoacid generator. The term "photo-acid generator" is recognized in the art and is intended to include those compounds which generate acid in response to radiant energy. Preferred photoacid generators for use in the present invention are those that are reactive to X-ray or an electron beam. The combination of the photo-acid generator and polymer should be soluble in an organic solvent. Preferably, the solution of the photo-acid generator and polymer in the organic solvent are suitable for spin coating. The photo-acid generator can include a plurality of photo-acid generators. The photo-acid generator is included in the composition at levels between about 0.01% and about 50%, more preferably between about 0.5% and about 20%, and most preferably between about 1.0% and about 10%, based on the total weight of the polymer composition.

Suitable photo-acid generators include onium salts, such as triphenylsulfonium salts, sulfonium salts, iodonium salts, diazonium salts and ammonium salts, 2,6-nitrobenzylesters, aromatic sulfonates, sulfosuccinimides and photosensitive organic halogen compounds as disclosed in Japanese Examined Patent Publication No. 23574/1979.

Examples of diphenyliodonium salts include diphenyliodonium triflate (DPI-105, Midori Kagaku Co. Ltd.) and diphenyliodonium tosylate (DPI-201, Midori Kagaku Co. Ltd.). Examples of suitable bis(4-tert-butylphenyl)iodonium salts include bis(4-tert-butylphenyl)iodonium triflate (BBI-105, Midori Kagaku Co. Ltd.), bis(4-tert-butylphenyl) iodonium camphorsulfate (BBI-106, Midori Kagaku Co. Ltd.), bis(4-tert-butylphenyl)iodonium perfluorbutylate (BBI-109, Midori Kagaku Co. Ltd.) and bis(4-tert-butylphenyl)iodonium tosylate (BBI-201, Midori Kagaku Co. Ltd.). Suitable examples of triphenylsulfonium salts include triphenylsulfonium hexafluorophosphate (TPS-102, Midori Kagaku Co. Ltd.), triphenylsulfonium triflate (TPS-105, Midori Kagaku Co. Ltd.) and triphenylsulfonium perfluorobutylate (TPS-109, Midori Kagaku Co. Ltd.). An example of an aromatic sulfonate is 1,2,3-tri (methanesulfonyloxy)benzene.

Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris (tribromomethyl)-s-triazine, tris(dibromomethyl)-s-triazine and 2,4-bis(tribromomethyl)-6-methoxyphenyl-s-triazine; halogen-containing benzenes such as (bis(trichloromethyl) benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such photosensitive organic halogen compounds, a bromine-containing compound is particularly preferred.

In another aspect, a polymer of a photoresist composition of the invention includes carbon atoms bearing protected hydroxyl groups, and the protecting groups are labile in the presence of in situ generated acid. The term "protected hydroxyl group" is well recognized in the art and is intended to include those groups which are resistant to basic solutions but are removed under acidic conditions. The hydroxyl groups of the polymer can be protected by chemical reactions by using protecting groups which render the reactive hydroxyl groups substantially inert to the reaction conditions. (See for example, Protective Groups in Organic Synthesis, 2 ed., T. W. Green and P. G. Wuts, John Wiley & Sons, New York, N.Y. 1991). Thus, for example, protecting groups such as the following may be utilized to protect hydroxyl groups: acetals, ketals, esters, e.g., t-butyl esters, and ethers known in the art; trialkyl silyl groups, such as trimethylsilyl and t-butyldimethylsilyl (TBDMS); and groups such as trityl, tetrahydropyranyl, vinyloxycarbonyl, o-nitrophenylsulfonyl, diphenylphosphinyl, p-toluenesulfonyl, and benzyl, may all be utilized. Additionally, $CH_3OCH_2Cl$, $(CH_3)_3SiCH_2CH_2OCH_2Cl$, $CH_3OCH_2CH_2OCH_2Cl$, $ClCO_2$-t-butyl, methyl dihydropyran, methyl dihydrofuran, tetrabutylvinylether, 2-methoxypropene, isobutylvinylether and ethylvinylether are useful as protecting groups. (See for example, C. Mertesdor et al. Microelectronics Technology, 1995, pg. 35–55.)

The protecting group may be removed, after completion of the synthetic reaction of interest, by procedures known to those skilled in the art. For example, acetal and ketal groups may be removed by acidolysis, the trityl group by hydrogenolysis, TBDMS by treatment with fluoride ions, and TCEC by treatment with zinc. One skilled in the art will appreciate that the choice of a hydroxyl protecting group(s) is tailored to the specific application and conditions to which the protected hydroxyl group must withstand. Ultimately, the generation of acid from the photo-acid will cleave the oxygen bond to the protecting group to regenerate a free hydroxyl group.

An interaction between an energy source, e.g. a source that generates 100-nm or less radiation, and the photo-acid generator results in the release of acid which facilitates selective cleavage of protecting groups from hydroxyl sites. As a consequence, the resultant unprotected hydroxyl groups are susceptible to solubilization under basic conditions, i.e., the regions of the photoresist material that are exposed to the far UV radiation are rendered alkali soluble, whereas the unexposed (protected hydroxyl) regions of the photoresist material remain alkali insoluble. Suitable protecting groups for the hydroxyl groups of the polymer include acetals, ketals, esters (including carbonates) and ethers.

In addition to the hydroxyl protected polymer and photo-acid generator, small molecules which help to inhibit hydrolysis of the protected hydroxyl groups can be included in the compositions of the invention. These small molecules are typically ester, ether, ketal or acetal protected low molecular weight polyhydridic alcohols or low molecular weight alcohols. The protecting groups can further include those listed below. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Co., Ltd. Tokyo, Japan).

Thus the above described compositions include protected hydroxyl groups which are labile in the presence of in situ generated acid. Upon exposure to a 100-nm or less energy source, e.g. a source which generates x-ray radiation, the photo-acid generator will release acid to facilitate selective cleavage of protecting groups from protected hydroxyl sites. As a consequence, the resultant unprotected hydroxyl groups will be susceptible to solubilization under basic conditions and the exposed photoresist material is rendered alkali soluble, whereas the unexposed photoresist material will remain alkali insoluble.

In another aspect, the invention provides a single layer 100-nm or less sensitive photoresist, which includes a photoresist composition having a polymer containing at least 10% fluorine moieties.

Although the above mentioned photoacid generators are suitable, one additional benefit is an increase in the density of the resist through the incorporation of fluorine in the polymer or PAG. Such as increase in fluorine density can result in improved resists for X-ray lithography by enhancing X-ray absorbance, thereby leading to increased resist sensitivity.

The following examples further elucidate the teachings of the invention described above. In particular, the examples illustrate the use of a variety of resist materials, some commercially available, to which further various copolymers, solvents and/or other components were added to generate photoresist compositions suitable for practicing the invention. For example, resist materials include Poly(4-hexafluoroisopropanolstyrene-co-t-butyl acrylate) (HFIPS-co TBA) was commercially available, and was further prepared from a 60:40 charge ratio of 4-hexafluoroisopropanolstyrene to t-butyl acrylate. Poly(4-hydroxystyrene-co-t-butyl acrylate) (HOST-co-TBA), commercially available, was obtained and then prepared from a 60:40 charge ratio of 44-hydroxystyrene to t-butyl acrylate. The photoacid generator (PAG) di-t-butylphenyl iodonium perfluorobutyl sulfonate (TBPI-PFBS), is commercially available. The base additive tetrabutyl amonium hydroxide (TBAH) is also commercially available.

General Lithography Process Conditions Within the Illustrated Examples

A post apply bake (PAB) was performed by placing a silicon wafer on a hot plate at a selected temperature and for a selected time. Development was achieved by utilizing Shipley LLD-26W, commercially available. The clearing dose ($E_0$) was the lowest exposure dose required to remove all resist after development. It was determined by either fitting a line through all points containing less than 80% normalized film thickness as a function of dose and determining the intercept for zero remaining film thickness, or if no slope could be determined, by noting the lowest exposure dose for which no resist remained. The contrast ($\gamma$) was determined by fitting a line through all points containing less than 80% normalized film thickness as a function of the log of dose and determining the absolute value of the slope. The unexposed film thickness loss (UFTL) was determined by subtracting the film thickness of an unexposed portion of the resist after development from the film thickness of the resist prior to exposure.

Preparation of HOST-co-TBA Based Acid Catalyzed Resist 1

The resist was prepared by adding 97 parts HOST-co-TBA polymer, 3 parts TBPI-PFBS, and 0.4 parts of TBAH to the amount of ethyl lactate solvent listed below to make either an approximately 3.5, 12.0 or 19.0% weight ratio of solids to total weight solution. The solution was rolled for at least an eight-hour period, and then filtered through a 0.2 $\mu$m filter.

| Resist | Solids (%) | Parts Ethyl Lactate | Polymer | PAG | Base |
|---|---|---|---|---|---|
| 1A | 3.5 | 2857 | HOST-co-TBA | TBPI- PFBS | TBAH |
| 1B | 12.0 | 833 | HOST-co-TBA | TBPI- PFBS | TBAH |
| 1C | 19.0 | 526 | HOST-co-TBA | TBPI- PFBS | TBAH |

Preparation of HOST-co-TBA Based Acid Catalyzed Resist 2

The resist was prepared by adding 94 parts of the HOST-co-TBA polymer, 6 parts TBPI-PFBS, and 0.4 parts TBAH to the amount of ethyl lactate solvent listed below to make either an approximately 3.5, 12.0 or 19.0% weight of solids to total weight solution. The solution was rolled for at least an eight-hour period, and then filtered through a 0.2 $\mu$m filter.

| Resist | Solids (%) | Parts Ethyl Lactate | Polymer | PAG | Base |
|---|---|---|---|---|---|
| 2A | 3.5 | 2857 | HOST-co-TBA | TBPI- PFBS | TBAH |
| 2B | 12.0 | 833 | HOST-co-TBA | TBPI- PFBS | TBAH |
| 2C | 19.0 | 526 | HOST-co-TBA | TBPI- PFBS | TBAH |

Preparation of HFIP-Based Positive Acid Catalyzed Resist 3

The resist was prepared by adding 97 parts of the HFIPB-co-TBA polymer, 3 parts TBPI-PFBS, and 0.4 parts TBAH to the amount of ethyl lactate solvent listed below to make either an approximately 3.5, 12.0 or 19.0% weight of solids to total weight solution. The solution was rolled for at least an eight-hour period, and then filtered through a 0.2 $\mu$m filter.

| Resist | Solids (%) | Parts Ethyl Lactate | Polymer | PAG | Base |
|---|---|---|---|---|---|
| 3A | 3.5 | 2857 | HFIPS-co-TBA | TBPI- PFBS | TBAH |
| 3B | 12.0 | 833 | HFIPS-co-TBA | TBPI- PFBS | TBAH |
| 3C | 19.0 | 526 | HFIPS-co-TBA | TBPI- PFBS | TBAH |

Preparation of HFIP-Based Positive Acid Catalyzed Resist 4

The resist was prepared by adding 94 parts of HFIPB-co-TBA polymer, 6 parts of TBPI-PFBS, and 0.4 parts of TBAH to the amount of ethyl lactate solvent listed below to make either an approximately 3.5, 12.0 or 19.0% weight of solids to total weight solution. The solution was rolled for at least an eight-hour period, and then filtered through a 0.2 $\mu$m filter.

| Resist | Solids (%) | Parts Ethyl Lactate | Polymer | PAG | Base |
|---|---|---|---|---|---|
| 4A | 3.5 | 2857 | HFIPS-co-TBA | TBPI- PFBS | TBAH |
| 4B | 12.0 | 833 | HFIPS-co-TBA | TBPI- PFBS | TBAH |
| 4C | 19.0 | 526 | HFIPS-co-TBA | TBPI- PFBS | TBAH |

Comparison of Resist 1 and 3 with X-ray Exposure (0.93 nm)

To determine $E_0$ and UFTL, the resist was spin cast to an approximately a 500 nm film on a hexamethyldisilazane (HMDS) vapor primed silicon wafer followed by a PAB of 130° C. for 60 seconds. The resist was exposed to 0.93 nm wavelength X-rays at a series of different doses between 0 and 3,000 mJ/cm$^2$. After exposure, the wafer underwent post exposure baked (PEB) for 130° C. for 90 seconds. The wafer was then immersed in a surfactant containing 2.38% aqueous tetramethyl ammonium hydroxide solution for 60 seconds, removed and rinsed with DI water, and dried under a stream of nitrogen gas. The $E_0$ and UFTL were then determined and are reported below.

| Resist | Polymer | Fluorine (%) | $E_0$ (mJ/cm$^2$) | UFTL (nm) | Contrast ($\gamma$) |
|---|---|---|---|---|---|
| 1B | HOST-co-TBA | 0.7 | 2040 | 20 | NA |
| 3B | HFIPS-co-TBA | 28.7 | 1110 | 15 | NA |

As will be appreciated by one skilled in the art, the two resists indicated are identical except for the type of polymer used in each. Resist 3B has a much higher level of fluorine due to the contributions from both the polymer, which contains 28.8% fluorine by weight, and the PAG, as opposed to Resist 1B in which the PAG is the only source of fluorine. The example shows that the sensitivity of the resist containing the high level of fluorine is 1.84 times higher than the resist containing low levels of fluorine. The results also show that the UFTL is low in all cases and that both resists are suitable of being used as a high-resolution X-ray resists.

Comparison of Resist 2 and 4 with X-Ray Exposure (0.93 nm)

To determine $E_0$ and UFTL, the resist was spin cast to an approximately a 500 nm film on a HMDS vapor primed silicon wafer followed by a PAB of 130° C. for 60 seconds. The resist was exposed to 0.93 nm wavelength X-rays at a series of different doses between 0 and 3000 mJ/cm$^2$. After exposure, the wafer underwent PEB at 130° C. for 90 seconds. The wafer was then immersed in a surfactant containing 2.38% aqueous tetramethyl ammonium hydroxide solution for 60 seconds, removed and rinsed with DI water, and dried under a stream of nitrogen gas. The $E_0$ and UFTL were then determined as reported below.

| Resist | Polymer | Fluorine (%) | $E_0$ (mJ/cm$^2$) | UFTL (nm) | Contrast ($\gamma$) |
|---|---|---|---|---|---|
| 2B | HOST-co-TBA | 1.5 | 1200 | 20 | NA |
| 4B | HFIPS-co-TBA | 28.6 | 820 | 15 | NA |

The two resists are identical except for the type of polymer used in each. Resist 4B has a much higher level of fluorine due to the contributions from both the polymer, which contains 28.8% fluorine by weight, and contribution from the PAG, as opposed to Resist 2B in which the PAG is the only source of fluorine. The example shows that the sensitivity of the resist containing the high level of fluorine is 1.46 times higher than that of the resist containing low levels of fluorine. The results further indicate that the UFTL is low in all cases, and that both resists are capable of being used as a high-resolution X-ray resists.

Comparison of Resist 1 and 3 with X-Ray Exposure (0.81 nm)

To determine $E_0$ and UFTL, the resist was spin cast to an approximately a 500 nm film on a HMDS vapor primed silicon wafer followed by a PAB of 130° C. for 60 seconds. The resist was exposed to 0.81 nm wavelength X-rays at a series of different doses between 0 and 3000 mJ/cm². After exposure, the wafer underwent PEB at 130° C. for 90 seconds. The wafer was then immersed in a surfactant containing 2.38% aqueous tetramethyl ammonium hydroxide solution for 60 seconds, removed and rinsed with DI water, and dried under a stream of nitrogen gas. The $E_0$ and UFTL were then determined and are reported below.

| Resist | Polymer | Fluorine (%) | $E_0$ (mJ/cm²) | UFTL (nm) | Contrast ($\gamma$) |
|---|---|---|---|---|---|
| 1B | HOST-co-TBA | 0.7 | 676 | 15 | 14.0 |
| 3B | HFIPS-co-TBA | 28.7 | 486 | 15 | 38.3 |

The two resists are identical except for the type of polymer used in each. Resist 3B has a much higher level of fluorine due to the contributions from both the polymer, which contains 28.8% fluorine by weight, and the PAG, as opposed to Resist 1B in which the PAG is the only source of fluorine. The example shows that the sensitivity of the resist containing the high level of fluorine is 1.39 times higher than the resist containing low levels of fluorine. The results also show that the UFTL is low in all cases, and that the contrast is high for both resists and both resists are thus capable of being used as a high resolution X-ray resists.

Comparison of Resist 2 and 4 with X-Ray Exposure (0.81 nm)

To determine $E_0$ and UFTL, the resist was spin cast to an approximately a 500 nm film on a HMDS vapor primed silicon wafer followed by a PAB of 130° C. for 60 seconds. The resist was exposed to 0.81 nm wavelength X-rays at a series of different doses between 0 and 3000 mJ/cm². After exposure, the wafer underwent PEB at 130° C. for 90 seconds. The wafer was then immersed in a surfactant containing 2.38% aqueous tetramethyl ammonium hydroxide solution for 60 seconds, removed and rinsed with DI water, and dried under a stream of nitrogen gas. The $E_0$ and UFTL were then determined and are reported below.

| Resist | Polymer | Fluorine (%) | $E_0$ (mJ/cm²) | UFTL (nm) | Contrast ($\gamma$) |
|---|---|---|---|---|---|
| 2B | HOST-co-TBA | 1.5 | 329 | 20 | 11.6 |
| 4B | HFIPS-co-TBA | 28.6 | 262 | 15 | 33.0 |

The two resists are identical except for the type of polymer used in each. Resist 3B has a much higher level of fluorine due to the contributions from both the polymer, which contains 28.8% fluorine by weight, and the PAG, as opposed to Resist 1B, in which the PAG is the only source of fluorine. The example shows that the sensitivity of the resist containing the high level of fluorine is 1.26 times higher than the resist containing low levels of fluorine. The results also show that the UFTL is low in all cases and that the contrast is high for both resists and both resists are thus capable of being used as a high resolution X-ray resists.

Comparison of Resist 1 and 3 with 157-nm Exposure

To determine $E_0$ and UFTL, the resist was spin cast to an approximately a 55 nm film on a HMDS vapor primed silicon wafer followed by a PAB of 130° C. for 60 seconds. The resist was exposed at 157-nm at a series of different doses between 0 and 7.5 mJ/cm². After exposure, the wafer underwent PEB at 130° C. for 90 seconds. The wafer was then immersed in a surfactant containing 2.38% aqueous tetramethyl ammonium hydroxide solution for 20 seconds, removed and rinsed with DI water, and dried under a stream of nitrogen gas. The $E_0$ and UFTL were then determined and are reported below.

| Resist | Polymer | Fluorine (%) | $E_0$ (mJ/cm²) | UFTL (nm) | Contrast ($\gamma$) |
|---|---|---|---|---|---|
| 1A | HOST-co-TBA | 0.7 | 0.6 | 3.9 | 15.1 |
| 3A | HFIPS-co-TBA | 28.7 | 0.6 | 16.7 | 12.4 |

The two resists are identical except for the type of polymer used in each. Resist 3A has a much higher level of fluorine due to the contributions from both the polymer, which contains 28.8% fluorine by weight, and the PAG, as opposed to Resist 1A in which the PAG is the only source of fluorine. The example shows that the sensitivity of the resist containing the high level of fluorine is the same as the resist containing low levels of fluorine. The results further show that the UFTL is low in all cases and that the contrast is high for both resists and both resists are thus capable of being used as a high resolution X-ray resists.

Comparison of Resist 2 and 4 with 157-nm Exposure

To determine $E_0$ and UFTL, the resist was spin cast to an approximately a 55 nm film on a HMDS vapor primed silicon wafer followed by a PAB at 130° C. for 60 seconds. The resist was exposed at 157-nm at a series of different doses between 0 and 7.5 mJ/cm². After exposure, the wafer underwent PEB at 130° C. for 90 seconds. The wafer was then immersed in a surfactant containing 2.38% aqueous tetramethyl ammonium hydroxide solution for 20 seconds, removed and rinsed with DI water, and dried under a stream of nitrogen gas. The $E_0$ and UFTL were then determined and are reported below.

| Resist | Polymer | Fluorine (%) | $E_0$ (mJ/cm²) | UFTL (nm) | Contrast ($\gamma$) |
|---|---|---|---|---|---|
| 2A | HOST-co-TBA | 1.5 | 0.46 | 1.0 | 4.7 |
| 4A | HFIPS-co-TBA | 28.6 | 0.46 | 0.0 | 4.4 |

The two resists are identical except for the type of polymer used in each. Resist 4A has a much higher level of fluorine due to the contributions from both the polymer, which contains 28.8% fluorine by weight, and the PAG, as opposed to Resist 2A in which the PAG is the only source of fluorine. The example shows that the sensitivity of the resist containing the high level of fluorine is the same as the resist containing low levels of fluorine. Further, the results show that the UFTL is low in all cases and that the contrast is high for both resists and both resists are thus capable of being used as a high resolution X-ray resist.

Comparison of Resist 1 and 3 with 248-nm Exposure

To determine $E_0$ and UFTL, the resist was spin cast as a film having a thickness of approximately 650 nm on a HMDS vapor primed silicon wafer followed by a PAB at 130° C. for 60 seconds. The resist was exposed at 248-nm at a series of different doses between 0 and 7.5 mJ/cm². After exposure, the wafer underwent PEB at 130° C. for 90 seconds. The wafer was then developed by single puddle with a surfactant containing 2.38% aqueous tetramethyl ammonium hydroxide solution for 45 seconds, removed and rinsed with DI water, and dried under a stream of nitrogen gas. The $E_0$ and UFTL were then determined and are reported below.

| Resist | Polymer | Fluorine (%) | $E_0$ (mJ/cm$^2$) | UFTL (nm) | Contrast ($\gamma$) |
|---|---|---|---|---|---|
| 1C | HOST-co-TBA | 0.7 | 17.4 | 5.0 | 5.8 |
| 3C | HFIPS-co-TBA | 28.7 | 21.9 | 25.9 | 7.4 |

The two resists are identical except for the type of polymer used in each. Resist 3A has a much higher level of fluorine due to the contributions from both the polymer, which contains 28.8% fluorine by weight, and the PAG as opposed to Resist 1A in which the PAG is the only source of fluorine. The example shows that the sensitivity of the resist containing the high level of fluorine is lower then the resist containing low levels of fluorine. The results finally show that the UFTL is low in all cases and that the contrast is high for both resists and both resists are thus capable of being used as a high resolution X-ray resist.

Comparison of Resist 2 and 4 with 157-nm Exposure

To determine $E_0$ and UFTL, the resist was spin cast to an approximately a 650 nm film on a HMDS vapor primed silicon wafer followed by a PAB of 130° C. for 60 seconds. The resist was exposed at 157-nm at a series of different doses between 0 and 7.5 mJ/cm$^2$. After exposure, the wafer underwent PEB at 130° C. for 90 seconds. The wafer was then developed by single puddle with a surfactant containing 2.38% aqueous tetramethyl ammonium hydroxide solution for 45 seconds, removed and rinsed with DI water, and dried under a stream of nitrogen gas. The $E_0$ and UFTL were then determined and are reported below.

| Resist | Polymer | Fluorine (%) | $E_0$ (mJ/cm$^2$) | UFTL (nm) | Contrast ($\gamma$) |
|---|---|---|---|---|---|
| 2C | HOST-co-TBA | 1.5 | 10.5 | 0.0 | 3.3 |
| 4C | HFIPS-co-TBA | 28.6 | 11.7 | 5.1 | 6.0 |

The two resists are identical except for the type of polymer used in each. Resist 4A has a much higher level of fluorine due to the contributions from both the polymer, which contains 28.8% fluorine by weight, and the PAG, as opposed to Resist 2A in which the PAG is the only source of fluorine. The example shows that the sensitivity of the resist containing the high level of fluorine is lower then the resist containing low levels of fluorine. The results further show-that the UFTL is low in all cases and that the contrast is high for both resists and both resists are thus capable of being used as a high-resolution X-ray resists.

This completes a description of photoresists applicable for use in X-ray and other high-energy lithography as described. The invention being thus disclosed, variations and modification will occur to and by those skilled in the art, and such are considered to be within the scope of the invention, as defined by the claims appended hereto.

Therefore, what is claimed is:

1. A method for lithography comprising
    applying a photoresist to a substrate, the photoresist comprising a polymer having a fluorine content of at least about 10% by polymer weight, and further comprising an acid generator; and
    exposing the photoresist to an ultra-short wavelength high energy actinic radiation so as to release electrons from fluorine in the photoresist composition that cause the acid generator to release acid.

2. The method of claim 1, further comprising selecting the polymer to be hexafluoroisopropanolstyrene.

3. The method of claim 1, further comprising selecting said high energy radiation to be photons having wavelengths below about 100 nm.

4. The method of claim 1, further comprising selecting said high energy radiation to be photons having wavelengths in a range of about 0.1 to about 30 nm.

5. The method of claim 1, further comprising selecting said high energy radiation to be photons having wavelengths in a range of about 0.5 nm to about 15 nm.

6. The method of claim 1, further comprising selecting said high energy radiation to be photons having wavelengths in a range of about 0.5 nm to about 10 nm.

7. The method of claim 1, further comprising selecting said high energy radiation to be photons having wavelengths in a range of about 0.8 nm to about 1.2 nm.

8. The method of claim 1, further comprising selecting the photoresist polymer to have a fluorine content greater than about 20% by polymer weight.

9. The method of claim 1, further comprising selecting the photoresist polymer to have a fluorine content greater than about 25% by polymer weight.

10. The method of claim 1, further comprising selecting the photoresist polymer to have a fluorine content greater than about 30% by polymer weight.

11. The method of claim 1, further comprising selecting the photoresist polymer to have a fluorine content greater than about 35% by polymer weight.

12. The method of claim 1, further comprising selecting the photoresist polymer to have a fluorine content greater than about 40% by polymer weight.

13. The method of claim 1, further comprising selecting the photoresist polymer to have a fluorine content greater than about 45% by polymer weight.

14. The method of claim 13, further comprising selecting the fluoropolymer to be a co-polymer.

15. The method of claim 13, further comprising selecting the fluoropolymer to be a ter-polymer.

16. The method of claim 1, further comprising selecting the photoresist polymer to have a fluorine content greater than about 50% by polymer weight.

17. The method of claim 1, further comprising selecting the fluoropolymer to comprise a fluorinated group attached to an aromatic moiety.

18. The method of claim 1, further comprising selecting the fluoropolymer to comprise a fluorinated alkylene moiety.

19. The method of claim 1, further comprising selecting the fluoropolymer to comprise any of a fluorinated acrylate or fluorinated methacrylate moiety.

20. The method of claim 1, further comprising selecting the fluoropolymer to comprise a monomer selected from the group consisting of 4-hexafluoroisopropanolstyrene, 3-hexafluoroisopropanolstyrene, and 2-hexafluoroisopropanolstyrene.

21. The method of claim 1, further comprising selecting the fluoropolymer to comprise 2,3,5,6-tetrafluoro-4-hydroxystyrene.

22. The method of claim 1, further comprising selecting the fluoropolymer to comprise any of 2,3-di(hexafluoroisopropanol)styrene, 2,4-di(hexafluoroisopropanol)styrene, 2,5-di(hexafluoroisopropanol)styrene, 2,6-di(hexafluoroisopropanol)styrene, or 3,4-di(hexafluoroisopropanol)styrene, or 3,5-di(hexafluoroisopropanol)styrene.

23. The method of claim 1, further comprising selecting the fluoropolymer to comprise at least one monomer selected from the group consisting of t-butylacrylate and t-butylmethacrylate, and a monomer selected from the group consisting of tert-butyl [2,2,2-trifluoro-1-trifluoromethyl-1-(4-vinylphenyl)ethoxy]acetate, 1-(2,2,2-trifluoro-1-methoxymethoxy-1-trifluoromethylethyl)-4-vinylbenzene, and 2,2,3,3,4,4,4-heptafluoro-1-(4-vinylphenyl)-1-butanone.

24. The method of claim 1, further comprising selecting the fluoropolymer to comprise at least one monomer selected from the group consisting of 3,5-di(trifluoromethyl) styrene, tetrafluoroethylene, trifluoroethylene, difluoroethylene, tetrafluorohydroxystyrene, t-butyl trifluoromethylacrylate, trifluoromethylacrylic acid, trifluoromethylacrylic acid esters, t-butyl fluoroacrylate, fluoroacrylic acid, fluoroacrylic acid esters, 2,2,3,4,4-pentafluorobut-3-enoic esters, 1,1 di(trifluoromethyl)-but-3-enol, 1,1 di(trifluoromethyl)-prop-2-enol, 2-fluorostyrene, 3-fluorostyrene, 4-fluorostyrene, 2,3,4,5,6-pentafluorostyrene, 2-trifluoromethylstyrene, 3-trifluoromethylstyrene, 4-trifluoromethylstyrene, 2-hexafluoroisopropyl styrene, 3-hexafluoroisopropyl styrene, 4-hexafluoroisopropyl styrene, 2-trifluoroacetyl styrene, 3-trifluoroacetyl styrene, 4-trifluoroacetyl styrene, 4-(1-oxy-2,2,3,3,4,4,4-heptafluorobutyl)styrene, 2-t-butyl acetate-hexafluoroisopropanol styrene, 3-t-butyl acetate-hexafluoroisopropanol styrene, 4-t-butyl acetate-hexafluoroisopropanol styrene, hexafluoroisopropyl acrylate, 2,3,5,6-tetrafluoro-4-hydroxystyrene.

25. The method of claim 1, further comprising selecting the acid generator to be fluorinated.

26. The method of claim 1, further comprising selecting the acid generator to comprise di-t-butylphenyl iodonium perfluorobutyl sulfonate (TBPI-PFBS).

27. The method of claim 1, further comprising selecting the photoresist to comprise a base additive.

28. The method of claim 22, further comprising selecting the base additive to comprise tetrabutyl amonium hydroxide.

29. A method for lithography comprising
applying a photoresist to a substrate, the photoresist comprising a fluorinated polymer having a fluorine content of at least about 10% by polymer weight, and further comprising an acid generator;
exposing the photoresist to a beam of electrons having an energy in a range of about 1 keV to about 200 keV so as to release electrons from fluorine in the photoresist composition.

30. The method of claim 29, further comprising selecting the fluorine content of the polymer to be at least about 20% by polymer weight.

31. The method of claim 29, further comprising selecting the fluorine content of the polymer to be at least about 25% by polymer weight.

32. The method of claim 29, further comprising selecting the fluorine content of the polymer to be at least about 30% by polymer weight.

33. The method of claim 29, further comprising selecting the fluorine content of the polymer to be at least about 35% by polymer weight.

34. The method of claim 29, further comprising selecting the fluorine content of the polymer to be at least about 40% by polymer weight.

35. The method of claim 29, further comprising selecting the fluorine content of the polymer to be at least about 45% by polymer weight.

36. The method of claim 29, further comprising selecting the fluoropolymer to comprise a fluorinated group attached to an aromatic moiety.

37. The method of claim 29, further comprising selecting the fluoropolymer to comprise a fluorinated alkylene moiety.

38. The method of claim 29, further comprising selecting the fluoropolymer to comprise any of a fluorinated acrylate or a fluorinated methacrylate moiety.

39. The method of claim 29, further comprising selecting the fluoropolymer to comprise a a monomeric unit selected to be hexafluoroisopropanolstyrene.

40. The method of claim 29, further comprising selecting the fluoropolymer to comprise a monomer selected from the group consisting of 4-hexafluoroisopropanolstyrene, 3-hexafluoroisopropanolstyrene, and 2-hexafluoroisopropanolstyrene.

41. The method of claim 29, further comprising selecting the fluoropolymer to comprise 2,3,5,6-tetrafluoro-4-hydroxystyrene.

42. The method of claim 29, further comprising selecting the fluoropolymer to comprise any of 2,3-di(hexafluoroisopropanol)styrene, 2,4-di(hexafluoroisopropanol)styrene, or 2,5-di(hexafluoroisopropanol)styrene, or 2,6-di(hexafluoroisopropanol)styrene, or 3,4-di(hexafluoroisopropanol)styrene, or 3,5-di(hexafluoroisopropanol)styrene Di-HFIP styrene.

43. The method of claim 29, further comprising selecting the fluoropolymer to comprise at least one monomer selected from the group consisting of t-butylacrylate and t-butylmethacrylate, and a monomer selected from the group consisting of tert-butyl [2,2,2-trifluoro-1-trifluoromethyl-1-(4-vinylphenyl)ethoxy]acetate, 1-(2,2,2-trifluoro-1-methoxymethoxy-1-trifluoromethylethyl)-4-vinylbenzene, and 2,2,3,3,4,4,4-heptafluoro-1-(4-vinylphenyl)-1-butanone.

44. The method of claim 29, further comprising selecting the acid generator to be fluorinated.

45. The method of claim 29, further comprising selecting the acid generator to comprise di-t-butylphenyl iodonium perfluorobutyl sulfonate (TBPI-PFBS).

46. The method of claim 29, further comprising selecting the photoresist to comprise a base additive.

47. The method of claim 29, further comprising selecting the base additive to comprise tetrabutyl ammonium hydroxide.

* * * * *